US011569815B1

(12) United States Patent
Chen et al.

(10) Patent No.: US 11,569,815 B1
(45) Date of Patent: Jan. 31, 2023

(54) HIGH ELECTRIC-THERMAL PERFORMANCE AND HIGH-POWER DENSITY POWER MODULE

(71) Applicants: Zhong Chen, Fayetteville, AR (US); Simon S. Ang, Fayetteville, AR (US); Junji Ke, Fayetteville, AR (US)

(72) Inventors: Zhong Chen, Fayetteville, AR (US); Simon S. Ang, Fayetteville, AR (US); Junji Ke, Fayetteville, AR (US)

( * ) Notice: Subject to any disclaimer, the term of this patent is extended or adjusted under 35 U.S.C. 154(b) by 90 days.

(21) Appl. No.: 17/071,280

(22) Filed: Oct. 15, 2020

Related U.S. Application Data

(60) Provisional application No. 62/915,262, filed on Oct. 15, 2019.

(51) Int. Cl.
H01L 23/50 (2006.01)
H01L 25/03 (2006.01)
H01L 25/11 (2006.01)
H03K 17/687 (2006.01)
H05K 1/11 (2006.01)

(52) U.S. Cl.
CPC ......... *H03K 17/6871* (2013.01); *H01L 23/50* (2013.01); *H01L 25/03* (2013.01); *H01L 25/115* (2013.01); *H05K 1/11* (2013.01)

(58) Field of Classification Search
CPC ..... H03K 17/6871; H01L 23/50; H01L 25/03; H01L 25/115; H05K 1/11
USPC ...................................................... 257/341
See application file for complete search history.

(56) References Cited

U.S. PATENT DOCUMENTS

| 8,410,600 | B2 | 4/2013 | Lostetter et al. ............. 257/700 |
| 9,275,938 | B1 | 3/2016 | McPherson et al. |
| 9,407,251 | B1 | 8/2016 | Passmore et al. ............ 361/743 |
| 9,426,883 | B2 | 8/2016 | McPherson et al. ......... 361/760 |
| 2004/0228094 | A1* | 11/2004 | Ahmed ................ H02M 7/003 257/E23.114 |
| 2019/0279927 | A1* | 9/2019 | Hartmann ............... H01L 25/18 |

OTHER PUBLICATIONS

De D, Castellazzi A, Solomon A, Trentin A, Minami M, and Hikihara T, "An all SiC MOSFET High Performance PV Converter Cell," in Proc. European Conference on Power Electronics and Applications (EPE), pp. 1-10, 2013.
Zhu Q, Wang L, Zhang L, Yu W, and Huang A, "Improved medium voltage AC-DC rectifier based on 10kV SiC MOSFET for Solid State Transformer (SST) Application," IEEE Applied Power Electronics Conference and Exposition, pp. 2365-2369, 2016.

(Continued)

*Primary Examiner* — Duy T Nguyen
(74) *Attorney, Agent, or Firm* — Keisling & Pieper PLC; David B. Pieper; Trent C. Keisling

(57) ABSTRACT

A rectangular power module with a body having two short ends defining a length and two long sides defining a width having three parallel circuit paths crossing the short width distance from side to side using side positioned gate terminals and planar top positioned top power terminal positioned between MOSFETS in the circuit for even thermal positioning and reduced current path, inductance, and resistance and increased power density.

14 Claims, 9 Drawing Sheets

(56) References Cited

OTHER PUBLICATIONS

Z. Chen, Y. Yao, D. Boroyevich, K. D. Ngo, P. Mattavelli, and K. Rajashekara, "A 1200-V, 60-A SiC MOSFET multichip phase-leg module for high-temperature, high-frequency applications," IEEE Transactions on Power Electronics, vol. 29, No. 5, pp. 2307-2320, 2014.

C. Chen, Z. Huang, L. Chen, Y. Tan, Y. Kang, and F. Luo, "A Flexible PCB based 3D Integrated SiC Half-Bridge Power Module with Three-Sided Cooling Using Ultra-Low Inductive Hybrid Packaging Structure," IEEE Transactions on Power Electronics, vol. 34, No. 6, pp. 5579-5593, 2018.

Kicin S, Traub F, Hartmann S, B. Enea, B. Christof, S. Stanislav and C. Francisco, "A New Concept of a High-Current Power Module Allowing Paralleling of Many SiC devices Assembled Exploiting Conventional Packaging Technologies". International Symposium on Power Semiconductor Devices and Ic's, Prague, Czech Republic, pp. 467-470, 2016.

B. Mouawad, J. Li, A. Castellazzi, J. C. Mark, E. Tobias and F. Peter, "Low Inductance 2.5 kV Packaging Technology for SiC Switches," International Conference on Integrated Power Electronics Systems, Nuremberg, Germany, pp. 1-6, 2016.

Y. Ren, X. Yang, F. Zhang, L. Wang, K. Wang, W. Chen, and Y. Pei, "Voltage suppression in wire-bond-based multichip phase-leg SiC MOSFET module using adjacent decoupling concept". IEEE Transactions on Industrial Electronics, vol. 64, No. 10, pp. 8235-8246, 2017.

Z. Liang, "Planar-bond-all: a Technology for Three-Dimensional Integration of Multiple Packaging Functions into Advanced Power Modules," IEEE International Workshop on Integrated Power Packaging, Chicago, USA, pp. 115-118, 2015.

N. Zhu, H. A. Mantooth, D. Xu, M. Chen and M. D. Glover, "A solution to Press-pack packaging of SiC MOSFETS". IEEE Transactions on Industrial Electronics, vol. 64, No. 10, pp. 8224-8234, 2017.

Dutta, Atanu, and Simon S. Ang. "A Module-Level Spring-Interconnected Stack Power Module." IEEE Transactions on Components, Packaging and Manufacturing Technology, pp. 1-8, 2018.

Romano G, Maresca L, Riccio M., et al. "Short-circuit failure mechanism of SiC power MOSFETs," in IEEE ISPSD, pp. 345-348, 2015.

Sheng Kuang, Guo Qing, Zhang Junming, and Qian Zhaoming, "Development and Prospect of SiC Power Devices in Power Grid," Proceedings of the CSEE, vol. 32, No. 30, pp. 1-7, Oct. 2012.

Wang Xuemei, "Researches and Applications of Wide Bandgap SiC Power Devices in Electric Vehicles," Proceedings of the CSEE, vol. 34, No. 3, pp. 371-379, Jan. 2014.

\* cited by examiner (a)

(b)

(a)             (b)

HIGH ELECTRIC-THERMAL PERFORMANCE AND HIGH-POWER DENSITY POWER MODULE

CROSS-REFERENCE TO RELATED APPLICATIONS

This application claims priority to and is a continuation-in-part of U.S. Patent Application Ser. No. 62/915,262, filed on Oct. 15, 2019 entitled High Electric-Thermal Performance and High-Power Density Power Module which is hereby incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in High Electric-Thermal Performance and High-Power Density Power Modules. More particularly, the invention relates to improvements particularly suited for power modules utilizing silicon carbide. In particular, the present invention relates specifically to a novel high electric-thermal performance and high-power density SiC power module packaging using electric-thermal co-design with layout and chip arrangement optimizations, side-by-side gate driver connector, and a low-profile power terminal integrated with screw thread.

2. Description of the Known Art

As will be appreciated by those skilled in the art, silicon carbide chips and power modules are known in various forms. Patents disclosing information relevant to power modules include: U.S. Pat. No. 9,426,883, issued to McPherson, et al. on Aug. 23, 2016 entitled Low profile, highly configurable, current sharing paralleled wide band gap power device power module; U.S. Pat. No. 9,407,251, issued to Passmore, et al. on Aug. 2, 2016 entitled Method for reworkable packaging of high speed, low electrical parasitic power electronics modules through gate drive integration; U.S. Pat. No. 9,275,938, issued to McPherson, et al. on Mar. 1, 2016 entitled Low profile high temperature double sided flip chip power packaging; and U.S. Pat. No. 8,410,600, issued to Lostetter, et al. on Apr. 2, 2013 entitled Semiconductor device with protecting film and method of fabricating the semiconductor device with protecting film. Each of these patents is hereby expressly incorporated by reference in their entirety.

A good example of a power module is WOLFSPEED, 3028 East Cornwallis Road, Research Triangle Park, N.C. 27709 model number CAS300M12BM2, a 300 A SiC power module on the market which has 15 nH power loop parasitic inductance and several decades nanohenry gate loop inductance. This module has significant asymmetry in thermal distribution.

Additional art of relevance for the present discussion regarding this application includes:

[1] SHENG Kuang, GUO Qing, ZHANG Junming, and QIAN Zhaoming. "Development and Prospect of SiC Power Devices in Power Grid." Proceedings of the CSEE, vol. 32, no. 30, pp. 1-7, October 2012.

[2] De D, Castellazzi A, Solomon A, Trentin A, Minami M, and Hikihara T, "An all SiC MOSFET High Performance PV Converter Cell," in Proc. European Conference on Power Electronics and Applications (EPE), pp. 1-10, 2013.

[3] WANG Xuemei, "Researches and Applications of Wide Bandgap SiC Power Devices in Electric Vehicles," Proceedings of the CSEE, vol. 34, no. 3. pp. 371-379. January 2014.

[4] Zhu Q, Wang L, Zhang L, Yu W, and Huang A, "Improved medium voltage AC-DC rectifier based on 10 kV SiC MOSFET for Solid State Transformer (SST) Application." IEEE Applied Power Electronics Conference and Exposition, pp. 2365-2369, 2016.

[5] Z. Chen, Y. Yao, D. Boroyevich, K. D. Ngo, P. Mattavelli, and K. Rajashekara, "A 1200-V, 60-A SiC MOSFET multichip phase-leg module for high-temperature, high-frequency applications," IEEE Transactions on Power Electronics, vol. 29, no. 5, pp. 2307-2320, 2014.

[6] C. Chen, Z. Huang, L. Chen, Y. Tan, Y. Kang, and F. Luo, "A Flexible PCB based 3D Integrated SiC Half-Bridge Power Module with Three-Sided Cooling Using Ultra-Low Inductive Hybrid Packaging Structure," IEEE Transactions on Power Electronics, vol. 34, no. 6, pp. 5579-5593, 2018.

[7] Kicin S, Traub F. Hartmann S. B. Enea, B. Christof, S. Stanislav and C. Francisco, "A New Concept of A High-Current Power Module Allowing Paralleling of Many SiC devices Assembled Exploiting Conventional Packaging Technologies". International Symposium on Power Semiconductor Devices and Ic's, Prague, Czech Republic, pp. 467-470, 2016.

[8] B. Mouawad, J. Li, A. Castellazzi, J. C. Mark, E. Tobias and F. Peter, "Low Inductance 2.5 kV Packaging Technology for SiC Switches," International Conference on Integrated Power Electronics Systems, Nuremberg, Germany. pp. 1-6, 2016.

[9] Y. Ren, X. Yang, F. Zhang, L. Wang, K. Wang, W. Chen, and Y. Pei, "Voltage suppression in wire-bond-based multichip phase-leg SiC MOSFET module using adjacent decoupling concept". IEEE Transactions on Industrial Electronics, vol. 64, no. 10, pp. 8235-8246, 2017.

[10] Z. Liang, "Planar-bond-all: A Technology for Three-Dimensional Integration of Multiple Packaging Functions into Advanced Power Modules," IEEE International Workshop on Integrated Power Packaging, Chicago, USA, pp. 115-118, 2015.

[11] N. Zhu, H. A. Mantooth, D. Xu, M. Chen and M. D. Glover, "A solution to Press-pack packaging of SiC MOSFETS". IEEE Transactions on Industrial Electronics, vol. 64, no. 10, pp. 8224-8234, 2017.

[12] Dutta, Atanu, and Simon S. Ang. "A Module-Level Spring-Interconnected Stack Power Module." IEEE Transactions on Components, Packaging and Manufacturing Technology, pp. 1-8, 2018.

[13] Romano G, Maresca L, Riccio M., et al. "Short-circuit failure mechanism of SiC power MOSFETs," in IEEE ISPSD, pp. 345-348, 2015.

Superior material physical properties such as the wide bandgap, high heat conductivity and the high speed of carriers provide more possibilities for silicon carbide (SiC) power semiconductor devices to replace traditional silicon (Si) power semiconductor devices in the power electronic converter systems [1]. Commercial products using SiC field effect transistors, especially SiC MOSFETs, have been compared with products of conventional Si MOSFETs and IGBTs, where it is found that the former have lower switching loss and conduction loss, higher temperature tolerance, and higher operating frequency. Excellent device properties will provide substantial system level performance improvements such as efficiency and power density when these devices are properly applied to power electronic circuits such as photovoltaic inverters [2], electric vehicles [3] and solid-state transformers [4].

Power device packaging often acts as the key bridge between power devices and the requirements of the particular application. However, the outstanding benefits of SiC devices cannot be fully utilized in current power converters due to that traditional standard packaging of silicon-based devices that is still being used in commercial SiC power modules. The limitations of this old style of packaging brings several challenges to scale applications of Sic devices and power modules.

SiC devices have much lower parasitic capacitance and charge faster than their silicon counterparts which makes SiC devices operable at faster switching rates. Therefore, SiC devices can operate at higher switching frequency and lower power loss [5]. However, high-speed switching features mean that the device will have a larger di/dt during switching transient. The larger di/dt will generate a higher voltage overshoot, Oscillation, and EMI noise at the same amount of loop parasitic inductance [6]. Therefore, a lower parasitic inductance should be realized for SiC devices. Typical methods to reduce the parasitic inductance in the power modules include current path optimization [7], mutual inductance cancellation [8], and capacitive decoupling [9]. The parasitic inductance can also be reduced by novel architecture of power modules, such as 2.5D planar package [10], 3D stacked packaging [11], and press-pack packaging [12]. However, current SiC devices are manufactured for wire-bond packaging. Complicate surface metallization, expensive gold-plated fuzz button and too many assembly steps brought from these novel packages significantly increases developing cycle and cost. In addition, the reliability of these packages has still not been fully investigated. Therefore, the optimization based on current fabrication process is a better trade-off among performance, cost, and reliability.

With limitations of the current rating of a single chip or device, power modules with paralleled multi-chips or the parallel connection of several discrete SiC MOSFET devices in a TO-package are commonly being developed to achieve high current capability. However, there is a current imbalance among the paralleled units (chips or devices) if their parameters and or the parasitic parameters of their corresponding circuits are not perfectly matched. This may result in a difference in the power losses of the individual units in the form of conduction and switching losses, which can result in thermal dissymmetry. Higher switching speed will also make current sharing between paralleled SiC devices more sensitive to the symmetry of layout compared to their silicon counterpart [6]. Therefore, a more symmetrical layout design should be considered.

In many power converter applications, especially for modern aircraft, high power density along with a reduction in its size and weight is a critical design target for saving space and reducing fuel consumption [5]. To address this, a thinner packaging structure can reduce the volume of power module, and higher power density would be further realized.

Current SiC MOSFET chips have smaller size and higher current density compared to their silicon counterparts. The temperature increases are higher and faster, especially at short circuit (SC) conditions [13]. Therefore, thermal performance should also be considered in chip arrangement design. In the commercial SiC power modules, the devices in the lower switching position are more closely packed than those of the upper switching position due to the layout constraint of the AC power terminal. This is because auxiliary source bond wire (for Kelvin connection) will be obstructed by the AC power terminal if chips of lower switching position are arranged similar to the chip arrangement of the upper switching position. It will cause the dissymmetry and degeneration of thermal performance. Therefore, co-design of both electrical and thermal performances is needed in SiC power module packaging design.

As an example, commercial 62-mm SiC power module packages with direct drop-in replacement of silicon (Si) devices limits many benefits of these SiC power devices. Although SiC MOSFET can operate at higher frequency due to its higher switching speed compared to Si IGBT, its upper limit of switching frequency is still limited by the large parasitic due to voltage overshoot, oscillation and electromagnetic interference (EMI) issues. The WOLFSPEED 1200V/300 A commercial SiC power module CAS300M12BM2 is a good example that has 15 nH power loop parasitic inductance and several decades nanohenry gate loop inductance. Therefore, a larger gate resistance should be used to suppress oscillation. However, the switching power loss will increase. The power density of this converter system could be increased with higher switching frequency due to a smaller size of passive components. The volume of power module could also be the one of bottlenecks of high-power density because this has a significantly large size of 106 mm×62 mm×30 mm. The chip arrangement is also limited by terminal position of this standard packaging. The dissymmetric thermal distribution will cause temperature concentration.

Applications and markets are always the important thrust for the emerging semiconductor devices. The final deployment of SiC devices and power modules in various applications demand better electro-thermal performance with more reliable and cost-effective packaging techniques. Current commercial power module packaging is manufactured based on silicon devices. However, more packaging consideration, lower parasitic inductance, and good thermal spread need to be addressed for SiC power modules due to superior device characterization. Although some novel packaging techniques have been proposed by academia and industry, higher cost, additional immature fabrication process and complicated assemblies bring many obstructions to scale application in power converters. In addition, these SiC MOSFET modules packaging do not have significant operational hours in the field yet, so the knowledge on the operational reliability of these devices is rather limited. Traditional wire-bond packaging has a more mature fabrication process. Their operational reliability has been demonstrated for decades. Therefore, combination of existing fabricating technology and innovation packaging design will take full advantage in the cost and performance.

From these prior references it may be seen that these prior art patents are very limited in their teaching and utilization, and an improved power module is needed to overcome these limitations.

SUMMARY OF THE INVENTION

The present invention is directed to an improved power module using an optimized layout design and chip arrangement, a side-by-side gate driver connector as well as low-profile power terminal integrated with a screw thread in a SiC power module based on a novel packaging approach. This SiC power module has ultra-low parasitic inductance (about 2 nH). The low-profile structure provides threefold increase of power density. A more symmetric chip arrangement makes current and thermal distribution more balanced. In addition, the phase-leg layout also provides a flexible circuit topology selection that allows for flexible application. Thus, the present power module provides a novel high electric-thermal performance and high-power density SiC power module packaging based on combination of traditional mature fabrication process with low cost and several packaging design innovations such as electric-thermal co-design, side-by-side gate driver connector, and low-profile power terminals integrated with a screw thread.

The present invention is useful in Photovoltaic inverters, Solid-state transformers, Electric vehicles. Aerospace inverters, Electric traction, Pulse power supplies, and Motor drives.

Advantages of the present invention include a lower parasitic inductance in the power loop and gate loop compared with conventional power modules; an increase in power density due to decrease in size of power module; a more symmetric chip arrangement that provides symmetric thermal spread paths and avoids thermal concentration; and a flexible circuit topology selection thanks to phase-leg layout.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

Figure 1:
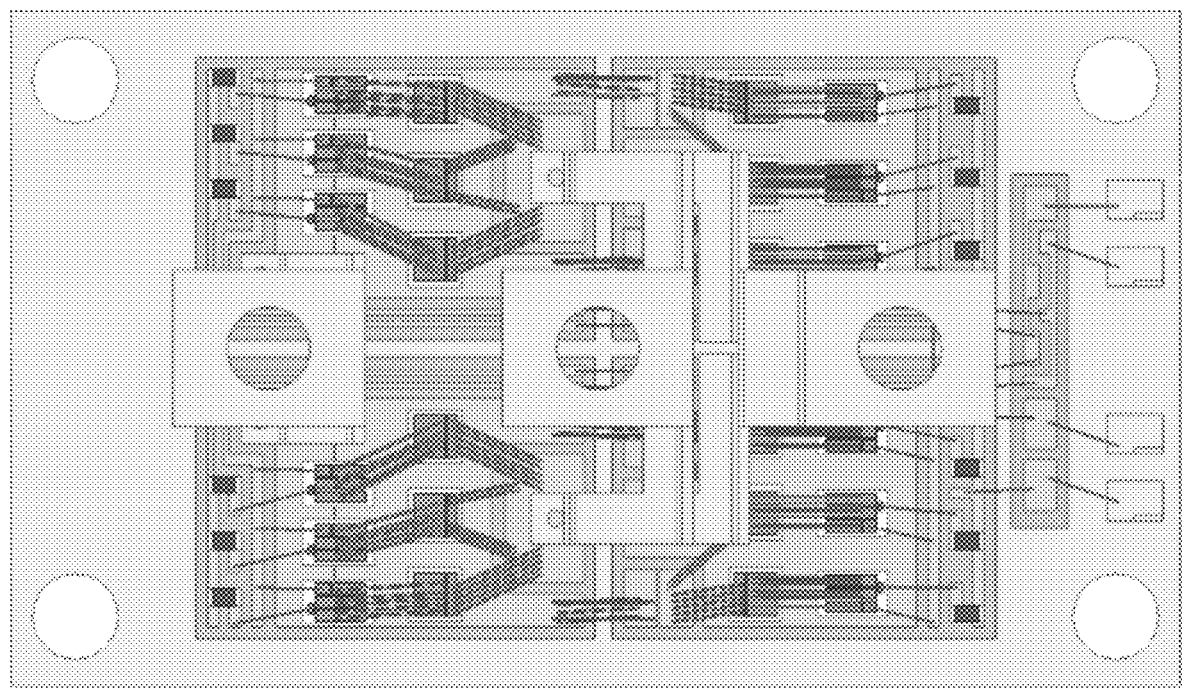
FIG. 1 shows a comparison between an (A) an Ansys Q3D Model of a commercial module and (B) the power module of the present invention.
Figure 1:
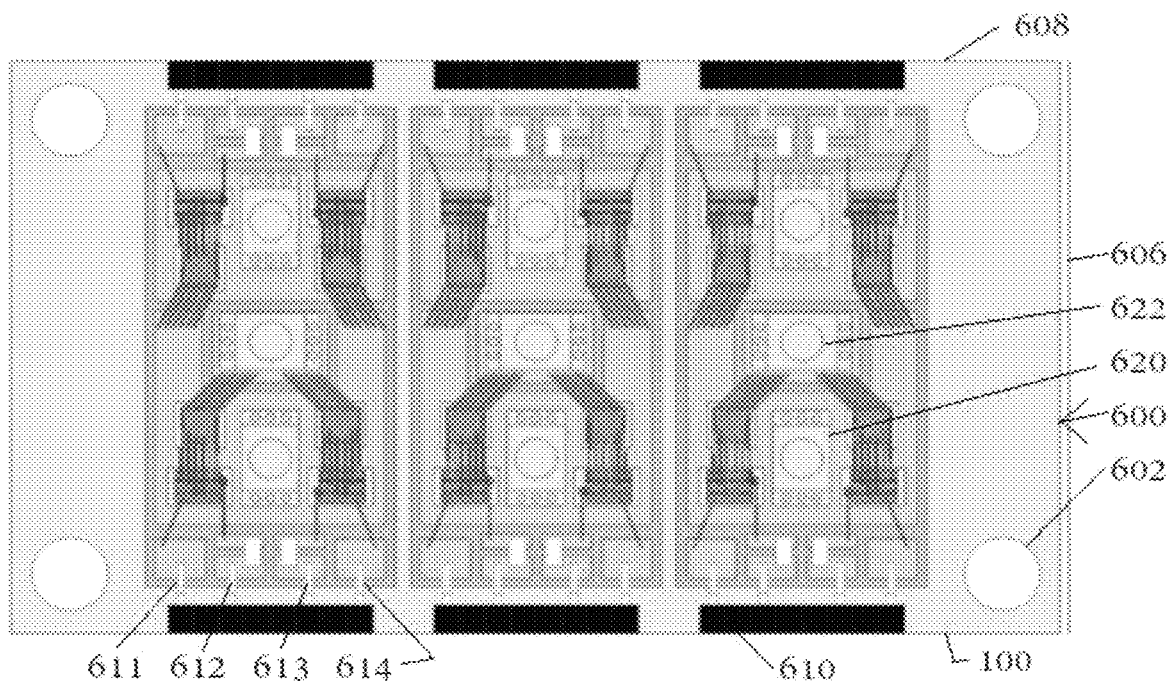
Figure 2:
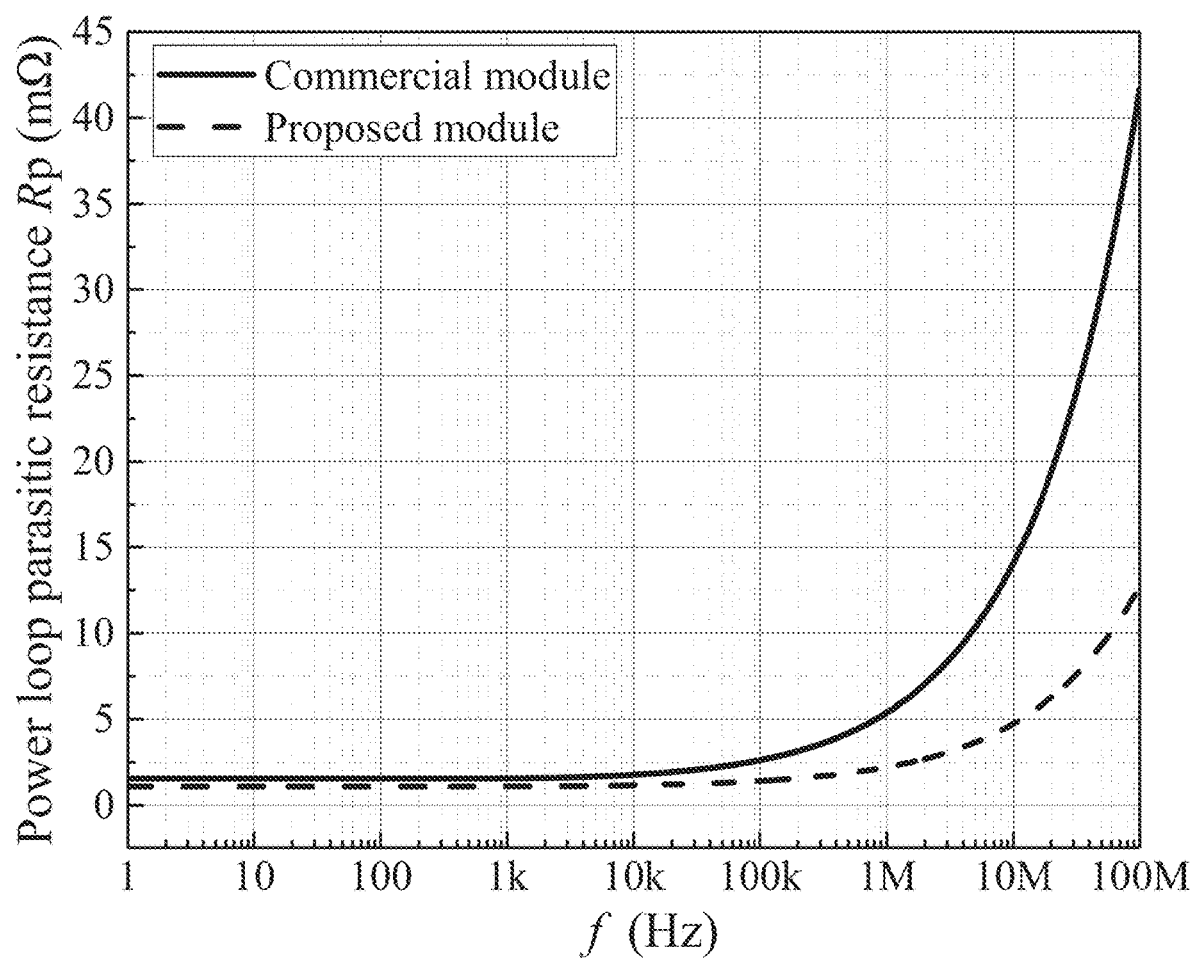
FIG. 2 shows a comparison result of optimizing power loop parasitic inductance between the modules.

As shown in FIG. 1(b) of the drawings and as detailed in FIGS. 2, 3, 4(b), 5(b), 6, 7, 8 and FIG. 9 one exemplary embodiment of the present invention is generally shown as a power module 100. The power module 100 has three parallel paths with each path including four pin side gates 610 and three single top connection power terminals 620. The four pin side gates 610 include electrical connections for gate 1, auxiliary-source 1, gate 2, auxiliary-source 2, and the three top terminals include electrical connections for V+. AC, and V− to implement three paralleled half bridge power circuits with each having two MOSFETs and two diodes.

Parasitic inductance, thermal resistance and volume have a huge impact on electric-thermal performance and power density for the emerging wide band gap semiconductor power modules. Power modules with lower parasitic inductance in the power loop and gate loop can operate at switching transients with lower voltage overshoot and smaller oscillation. Thermal symmetry is also significant for power module reliability. An even thermal spread path is helpful to avoid the thermal concentration on parts of dies inside power module. In addition, high-density power modules are the core of many power electronic applications such as electric vehicles, power grid, rail transportation, energy storage, renewable energy and space aircraft. Using the present invention, it is shown how high-density power modules based on wide hand gap devices can be realized through the volume reduction. This invention provides a novel packaging approach for SiC devices to enable high electric-thermal performance as well as supporting the demand in increasing power density. This invention demonstrates the optimization method and fabrications process of high density SiC power modules.

Starting with the comparison of FIG. 1 we note that total parasitic inductance in the power loop is defined as the parasitic inductance from DC+ to DC−. It mainly comes from two parts. One part is layout including direct bond circuit (DBC) traces and bonding wires. The other one is terminals including DC+ terminal and DC− terminal. In order to significantly reduce the parasitic inductance in power loop, two main methodologies are utilized in the present design including current path optimization and mutual inductance cancellation. Layout and terminals design in the present invention use shorter and wider current paths. For current commercial standard power module with 106 mm×62 mm×30 mm packaging, a 106 mm×62 mm×3 mm baseplate is used to provide thermal path from the device to a heatsink. To avoid changing some system-level designs and increasing more cost, the dimension of the baseplate in the current design and all fabrication processes use the traditional approach. With the same size of a rectangular baseplate having a short end and a long side, note that both DBCs and semiconductor dies are rotated 90 degrees compared to the layout inside the commercial module. This places the gate terminals on the long side of the rectangle. This can provide larger area for DBCs and dies. The current path in the power loop will flow across the short dimension of the baseplate for realizing shorter and wider paths. In addition, one should specifically note how the DC+ terminal and DC− terminal are placed as close as possible for strengthening the mutual inductance cancellation effect such that the parasitic inductance is further reduced. When the placement results in a mutual inductance cancellation effect, the terminals are within a mutual inductance cancellation proximity. Note how the power terminals are now positioned between the MOSFETS and thanks to this short path DBC arrangement, all dies could be placed more even and with a larger interval. Therefore, better thermal spread path and uniform temperature distribution can be realized. In order to reduce the parasitic inductance in gate loops, the gate and auxiliary source interfaces design uses a side-by-side placement of gate sockets in this embodiment. This allows the external gate driver to be placed as close as possible such that a smaller gate loop area is realized. Therefore, the parasitic inductance in the gate loop is also reduced. To minimize the height of power module and shorten current path, new rectangular end foot low-profile top connection copper cylinder structures with top connection apertures with an integrated screw thread are used for power terminals. In addition, a customized housing is designed and fabricated by using 3D printer to compatible with proposed terminal structure.

Figure 3:
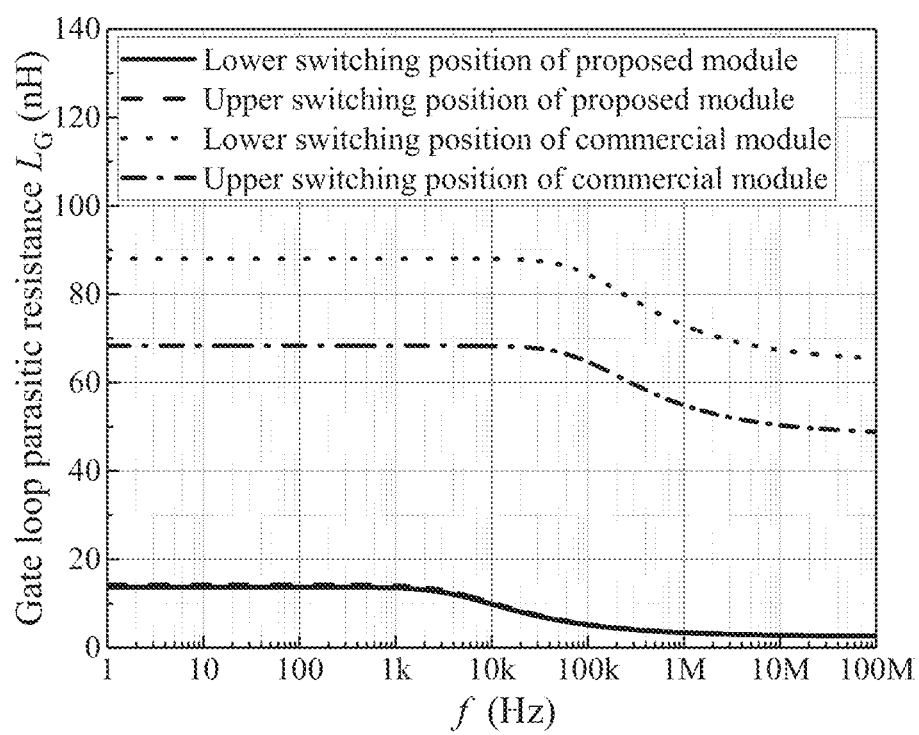
FIG. 3 shows a comparison result of optimizing gate loop parasitic inductance between the modules.

The 3D models of commercial module and proposed module have been built using Ansys Q3D (FIG. 1) for comparison. Simulation results show that the power loop parasitic inductance of proposed module is 2.1 nH at 10 MHz, which is much smaller than that of the commercial module (i.e., 15 nH at 10 MHz). As shown in FIG. 3, the parasitic inductance of gate loop for the lower and upper switching positions for the commercial module are 74 nH and 54 nH, respectively. These values are substantially reduced to 2.82 nH and 2.86 nH, respectively, for our proposed module.

Figure 4:
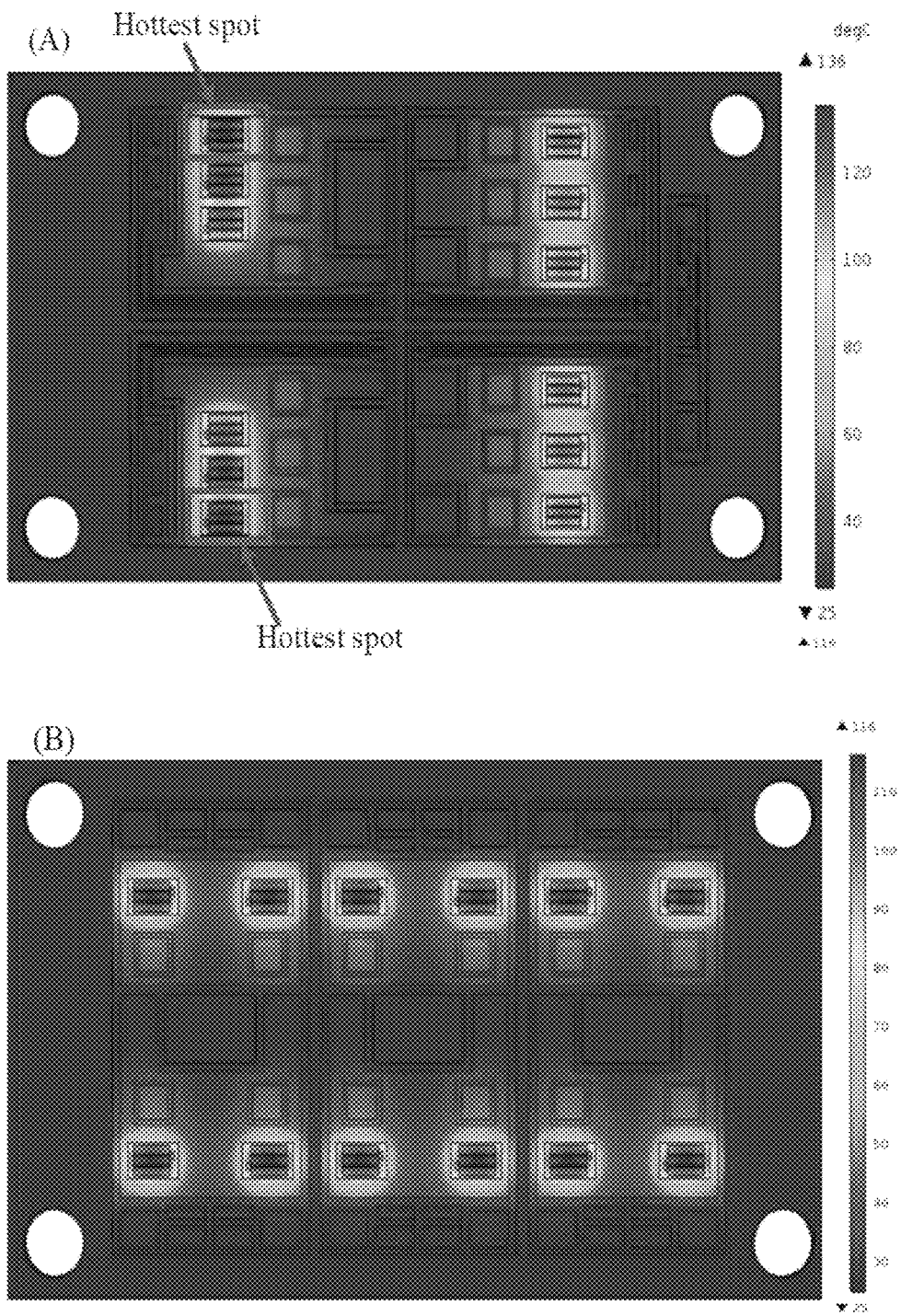
FIG. 4 shows comparison results of improving thermal performance between an (A) an Ansys Q3D Model of a commercial module and (B) the power module of the present invention.
Figure 5:
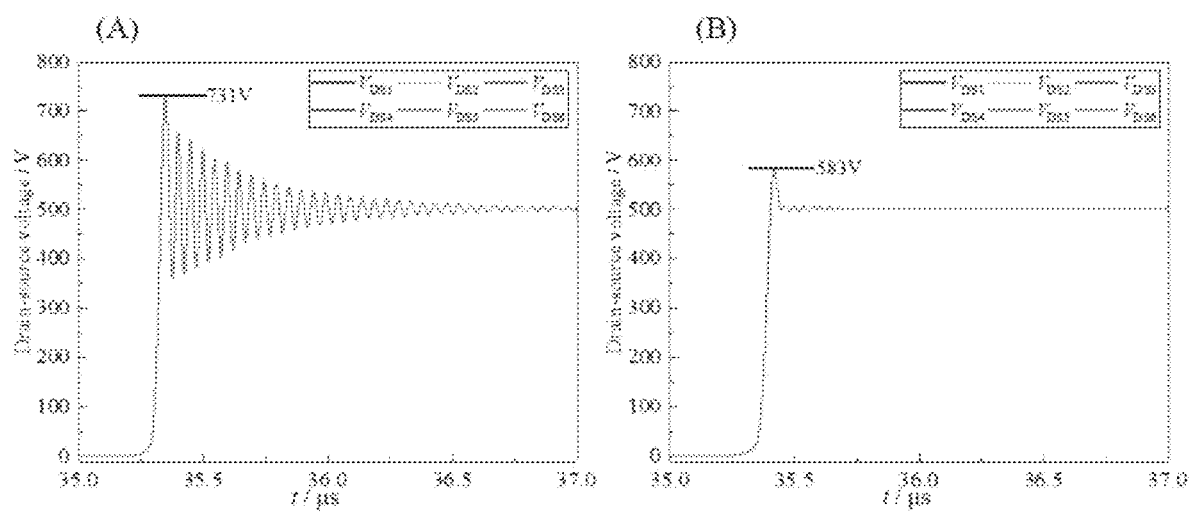
FIG. 5 shows a comparison of the turn-off voltage overshoot between an (A) an Ansys Q3D Model of a commercial module and (B) the power module of the present invention.

The simulation results of thermal performance of a 1200V300 A SiC power module based on commercial packaging and proposed packaging are presented in COMSOL. The same power of 139 W was applied into each SiC MOSFET, and the temperature of baseplate set at 25° C. The hottest spot is coincided with location of the chips of the lower switching position, and close to the edge of DBC (FIG. 4A). This is because chips in the lower switching position are located more closely than those in the upper switching position due to the obstruction by the AC terminal. The combined effect of having a smaller distance between chips and a smaller distance between a chip and the edge of DBC is the occurrence of the highest temperature at these two locations under the same power. While, the temperature distribution is even in proposed power module (FIG. 4B). The peak temperature has been reduced from 136° C. to 116° C. at the same condition.

In order to validate the improvement of switching performance attributed to the reduction of parasitic inductance, all parasitic parameters including parasitic resistance, self-inductance and mutual inductance are extracted in Ansys Q3D and then exported in the form of multiport network spice model. From the observation of simulation results (FIG. 5), the turn-off voltage overshoot has been reduced from 46.2% to 16.6% at same switching speed.

Figure 6:
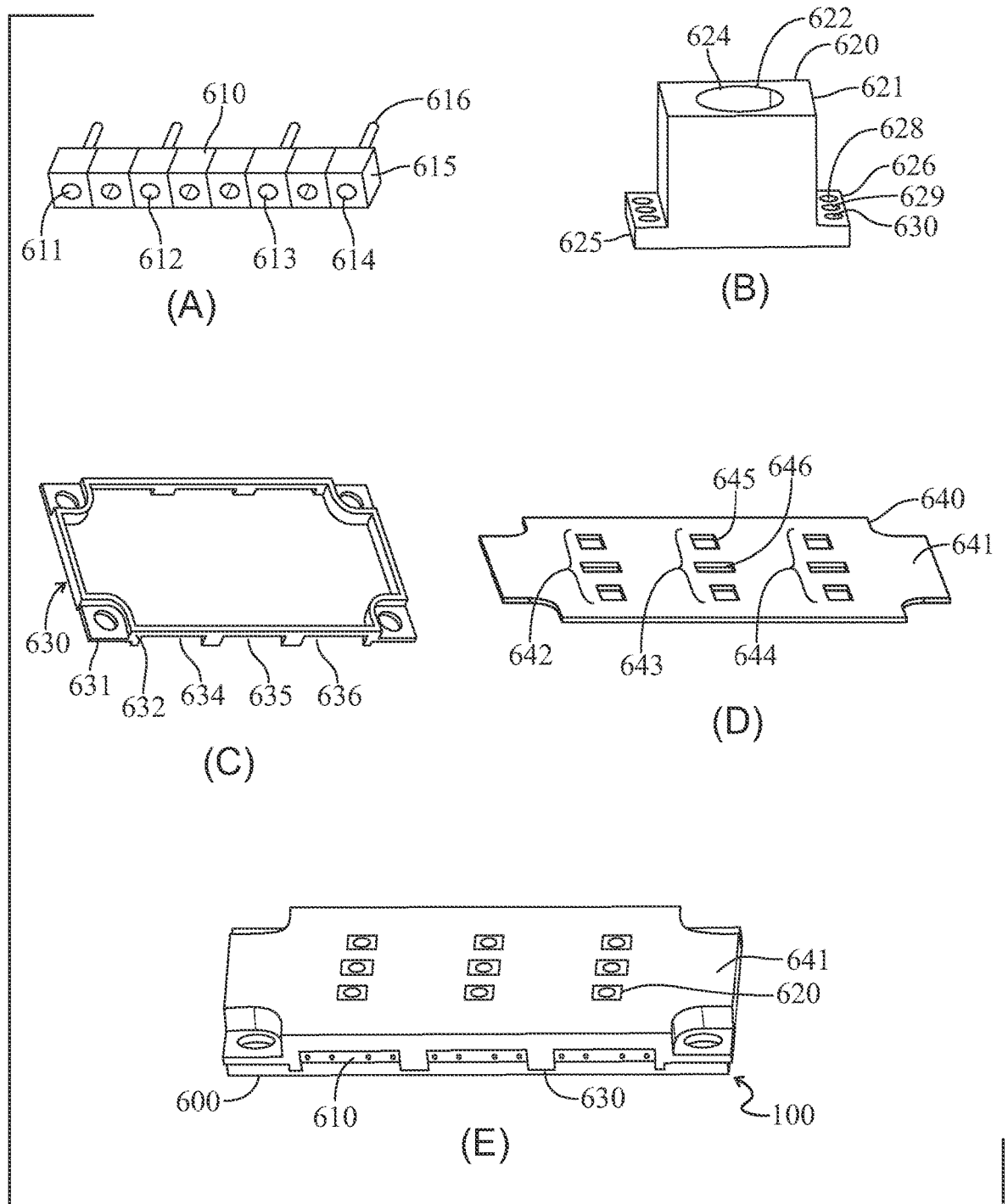
FIG. 6 shows a packaging design including the A) gate signal socket B) side foot power terminal body with raised screw hole and thread C) the three-phase path housing side gate socket frame D) power terminal housing lid; and E) power module after assembly.
Figure 7:
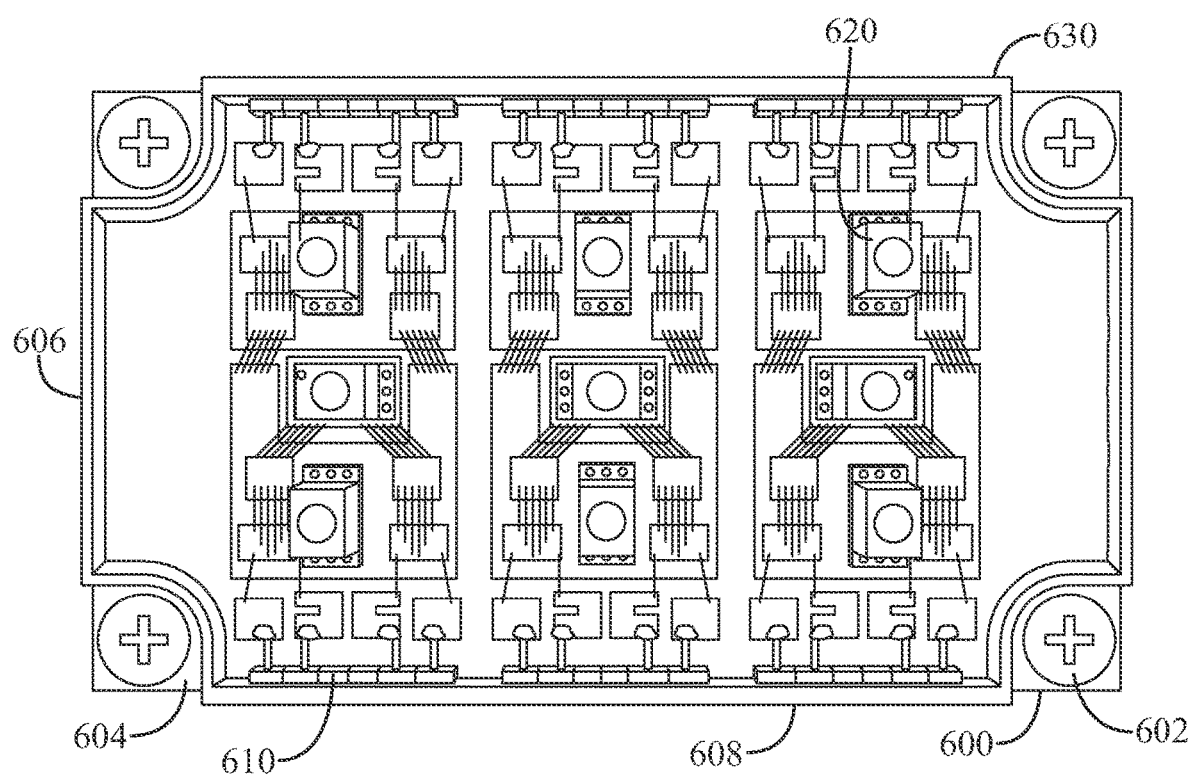
FIG. 7 shows a fabricated SiC power module sample before addition of the housing lid.
Figure 8:
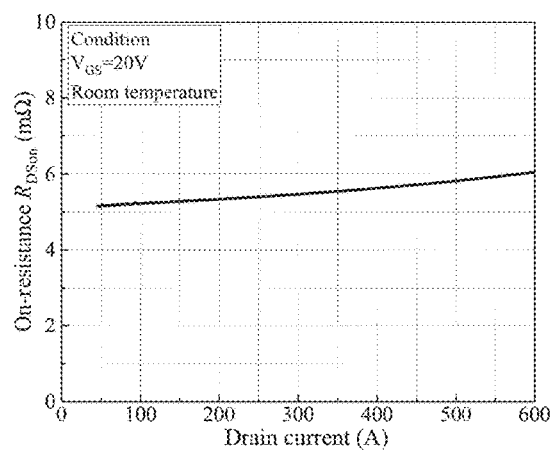
FIG. 8 shoes the test results of the static characterization A) transfer curve; and B) output curve.
Figure 8:
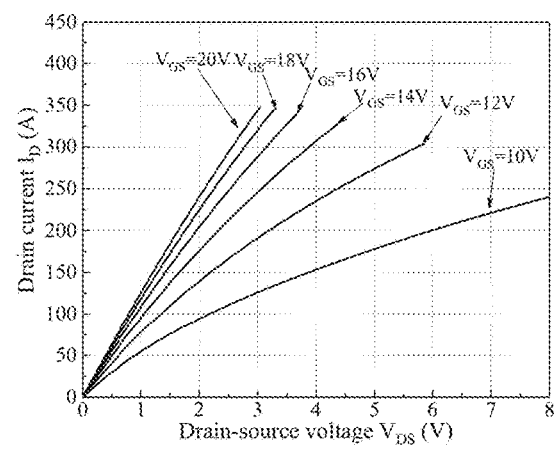

A detailed packaging design is presented in FIG. 6. A special gate signal socket 610 (FIG. 6A) is used to connect the gate of device and external gate driver. A raised top threaded for connected power terminal 620 with a body 610 defining a connection aperture 622 with thread 624 (FIG. 6B) and extending connection feet 628 with connection foot vias 628 is designed for providing both function of a copper terminal and fastener. Therefore, this power terminal 620 does not require additional fasteners. In this manner a simplified fabrication can be realized. A specific housing frame 630 (FIG. 6C) and separated housing lid 640 (FIG. 6D) are designed to encase a filling material around the power semiconductor devices and the power terminals 620. The total height of proposed module 100 packaging after assembly (FIG. 6E) is about 10 mm. In this manner the volume can be decreased by ⅔ compared to standard commercial module. Consequently, its power density increases threefold and weight reductions may be achieved.

To validate the feasibility of this packaging, a 1200V/300 A power module sample (FIG. 7) has been fabricated. The output (FIG. 8A) and on-resistant (FIG. 8B) characterizations of this fabricated module have been tested. Test results are consistent with data provided in datasheet. Therefore, this proves that this fabricated power module can work normally.

Fabrication process of this packaging has been demonstrated by the 1200V/300 A SiC power module in collaboration with resources at the University of Arkansas to develop commercial manufacturing techniques.

The transient switching performance of fabricated SiC; power module will also be evaluated, A customized test platform has been developed to do double pulse test for all power module based on this packaging design. The 12000V/ 300 A SiC power module sample will be tested.

From the point of view of assembly and manufacture, the sophisticated bending of terminals which is usually a limitation of low-profile fabrication of terminals, can be avoid for the proposed design. In addition, this power terminal structure does not require additional fasteners due to the integration of screw thread and hole. All these considerations would make fabrication more simplified.

Figure 9:
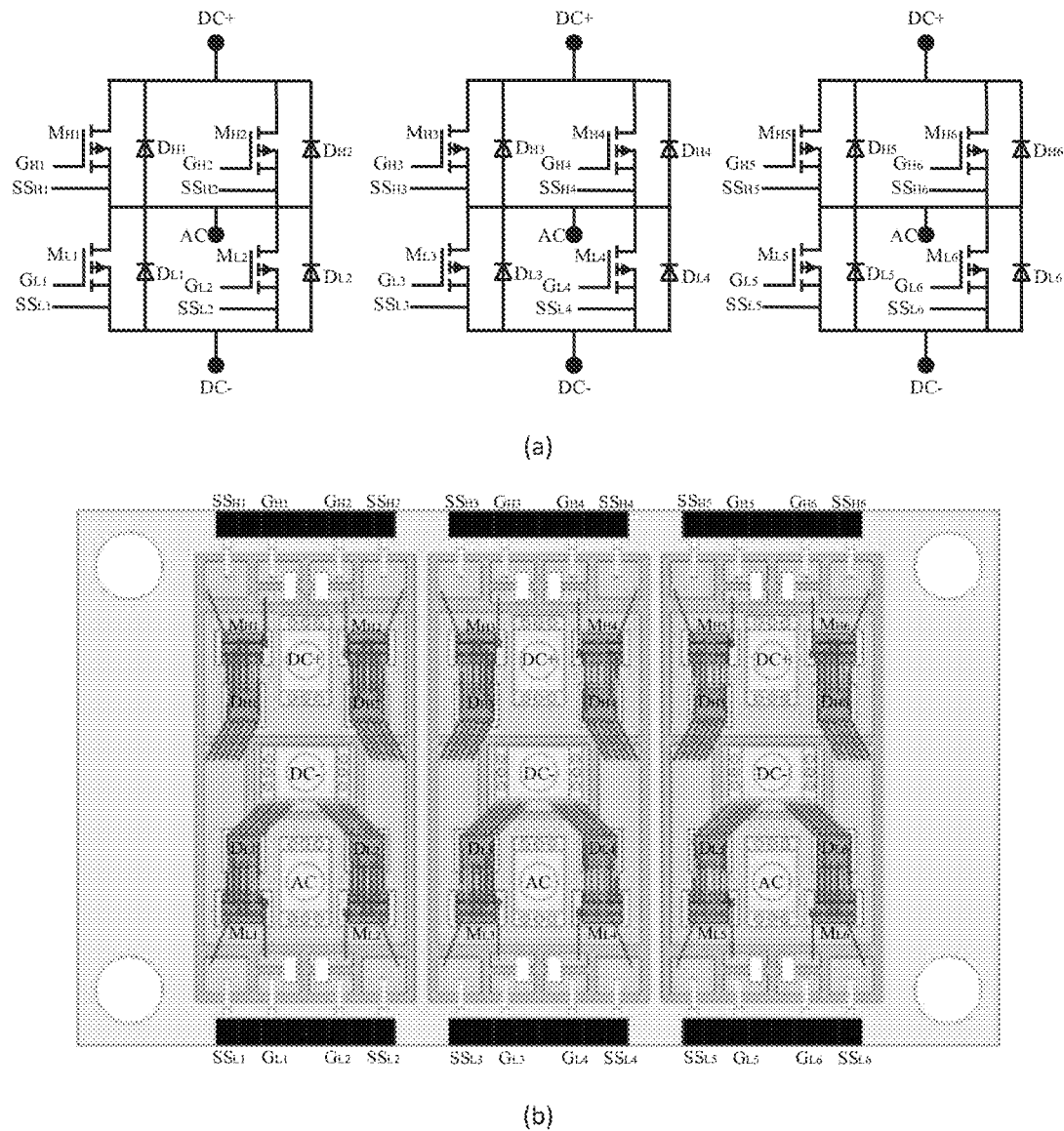
FIG. 9 shows the (a) electrical schematic and (b) layout of the power module of the present invention.

FIG. 9 shows the (a) electrical schematic and (b) layout of the power module of the present invention with: Si(silicon Carbide); MOSFET (metal oxide semiconductor field effect transistor); SBD (Schottky Barrier Diode); SCCS (short-connected copper sheets).

Interpretation

ML$j$ (i=1, 2, 3, 4, 5, 6): SiC MOSFET die M$j$ in the lower switching positions.

MH$j$ (j=0, 1, 2, 3, 4, 5, 6): SiC MOSFET die M$j$ in the upper switching positions.

DL$j$ (j=1, 2, 3, 4, 5, 6): SiC SBD die M$j$ in the lower switching positions.

DH$j$ (j=1, 2, 3, 4, 5, 6): SiC SBD die M$j$ in the upper switching positions.

GL$j$ (j=1, 2, 3, 4, 5, 6) is the gate terminal for SiC MOSFETs ML$j$ (j=1, 2, 3, 4, 5, 6).

GH$j$ (j=1, 2, 3, 4, 5, 6) is the gate terminal for SiC MOSFETs MH$j$ (j=1, 2, 3, 4, 5, 6).

SSL$j$ (=1, 2, 3, 4, 5, 6) is the auxiliary source terminal for SiC MOSFETs ML$j$ (j=1, 2, 3, 4, 5, 6)

SSH$j$ (j=1, 2, 3, 4, 5, 6) is the auxiliary source terminal for SiC MOSFETs MH$j$ (j=1, 2, 3, 4, 5, 6).

Additional reference numerals used throughout the detailed description and the drawings correspond to the following elements:
Power module 100
Rectangular base plate 600
Corner mounting apertures 602
Planar bottom 604
Short end 606
Long side 608
gate signal socket 610
first terminal 611
second terminal 612
third terminal 613
fourth terminal 614
terminal side input 615
side input socket body 615
internal terminal circuit connection 616
power terminal 620
rectangular terminal body 621
   top connection aperture 622
      connection thread 624
   first short end lower extending connection foot 625
   second short end lower extending connection foot 626
      first connection foot via 628
      second connection foot via 629
      third connection foot via 630
rectangular housing frame 630
first height corner apertures 631
second height side wall 632
   corner indented shoulders 633
   long side first gate aperture 634
   long side second gate aperture 635
   long side third gate aperture 636
flush planar housing lid 640
   planar top surface 641
   first set of power connection apertures 642
   second set of power connection apertures 643
   third set of power connection apertures 644
      first side to side orientation 645
      end to end orientation 646

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. An electrical power module apparatus, comprising:
   a rectangular base plate with a first short end and a second short end connected by a first long side and a second long side and a top;
   a first half bridge power circuit including a first gate signal connection positioned on the first long side and a second gate signal connection positioned on the second long side;
   the first half bridge power circuit including a first alternating current terminal, a first direct current positive terminal, and a first direct current negative terminal;
   the first alternating current terminal and first direct current positive terminal positioned opposite sides of and adjacent to the first direct current negative terminal on the top of the rectangular base plate; and
   the first half bridge power circuit including a first metal oxide semiconductor field effect transistor and a second metal oxide semiconductor field effect transistor with the first alternating current terminal positioned between the first and second metal oxide semiconductor field effect transistors.

2. The power module apparatus of claim 1, further comprising:
   the first alternating current terminal, the first direct current positive terminal, and the first direct current negative terminal positioned as a first terminal line parallel to the first short end between the first gate signal connection and the second gate signal connection.

3. The power module apparatus of claim 2, further comprising:
   the first power metal oxide semiconductor field effect transistor controlled by the first gate signal connection positioned between the first short end and the first terminal line; and
   the second power metal oxide semiconductor field effect transistor controlled by the first gate signal connection and positioned between the second short end and the first terminal line.

4. The power module apparatus of claim 3, further comprising:
   a third power metal oxide semiconductor field effect transistor controlled by the second gate signal connection positioned between the first short end and the first terminal line; and
   a fourth power metal oxide semiconductor field effect transistor controlled by the second gate signal connection and positioned between the first terminal line and the second short end.

5. The power module apparatus of claim 4, further comprising:
   the first power metal oxide semiconductor field effect transistor positioned adjacent to the first gate signal connection;
   the second power metal oxide semiconductor field effect transistor positioned adjacent to first gate signal connection;
   the third power metal oxide semiconductor field effect transistor positioned adjacent to the second gate signal connection; and
   the fourth power metal oxide semiconductor field effect transistor positioned adjacent to the second gate signal connection.

6. The power module apparatus of claim 2, further comprising:
- a second half bridge power circuit including a third gate signal connection positioned on the first long side and a fourth gate signal connection positioned on the second long side;
- the second half bridge power circuit including a second alternating current terminal, a second direct current positive terminal, and a second direct current negative terminal positioned as a second terminal line parallel to the first short end between the third gate signal connection and the fourth gate signal connection.

7. The power module apparatus of claim 6, further comprising:
- a third half bridge power circuit including a fifth gate signal connection positioned on the first long side and a sixth gate signal connection positioned on the second long side;
- the third half bridge power circuit including a third alternating current terminal, a third direct current positive terminal, and a third direct current negative terminal positioned as a third terminal line parallel to the first short end between the fifth gate signal connection and the sixth gate signal connection.

8. The power module apparatus of claim 1, further comprising:
- the first direct current positive terminal positioned adjacent to the first direct current negative terminal within a mutual inductance cancellation proximity.

9. The power module apparatus of claim 1, further comprising:
- a second half bridge power circuit including a third gate signal connection positioned on the first long side and a fourth gate signal connection positioned on the second long side; and
- a third half bridge power circuit including a fifth gate signal connection positioned on the first long side and a sixth gate signal connection positioned on the second long side.

10. The power module apparatus of claim 1, further comprising:
- at least one of the first alternating current terminal, first direct current positive terminal, and first direct current negative terminal including a power terminal;
- the power terminal including a rectangular terminal body with a top connection aperture defining a connection thread,
- the power terminal further defining a first short end lower extending connection foot defining a first connection foot via.

11. An electrical power module apparatus, comprising:
- a rectangular base plate with a top, and a first short end and a second short end connected by a first long side and a second long side;
- a first alternating current terminal and a first direct current positive terminal positioned opposite sides of and adjacent to a first direct current negative terminal on the top of the rectangular base plate; and
- a first half bridge power circuit including a first gate signal connection positioned on the first long side and a second gate signal connection positioned on the second long side;
- a second half bridge power circuit including a third gate signal connection positioned on the first long side and a fourth gate signal connection positioned on the second long side; and
- a third half bridge power circuit including a fifth gate signal connection positioned on the first long side and a sixth gate signal connection positioned on the second long side.

12. An electrical power module apparatus, comprising:
- a rectangular base plate with a top, and a first end and a second end connected by a first side and a second side;
- a first alternating current terminal and a first direct current positive terminal positioned opposite sides of and adjacent to a first direct current negative terminal on the top of the rectangular base plate; and
- a half bridge power circuit including a gate signal connection positioned on the first side;
- the half bridge power circuit including the first alternating current terminal, the first direct current positive terminal, and the first direct current negative terminal; and
- a power metal oxide semiconductor field effect transistor electrically connected to the gate signal and the first alternating current terminal, the power metal oxide semiconductor field effect transistor and positioned adjacent to the first alternating current terminal.

13. The power module apparatus of claim 12, further comprising:
- a diode electrically connected in parallel to the power metal oxide semiconductor field effect transistor, the diode positioned adjacent to the first alternating current terminal.

14. The power module apparatus of claim 12, further comprising:
- the first direct current positive terminal positioned adjacent to the first direct current negative terminal.

* * * * *